(12) United States Patent
Hamburgen et al.

(10) Patent No.: US 9,445,517 B2
(45) Date of Patent: Sep. 13, 2016

(54) ETCHED MULTI-LAYER SHEETS

(71) Applicant: GOOGLE INC., Mountain View, CA (US)

(72) Inventors: William Hamburgen, Palo Alto, CA (US); Lawrence Lam, San Jose, CA (US); James Tanner, Los Gatos, CA (US)

(73) Assignee: Google Inc., Mountain View, CA (US)

( * ) Notice: Subject to any disclaimer, the term of this patent is extended or adjusted under 35 U.S.C. 154(b) by 376 days.

(21) Appl. No.: 13/841,839

(22) Filed: Mar. 15, 2013

(65) Prior Publication Data

US 2013/0322035 A1    Dec. 5, 2013

Related U.S. Application Data

(60) Provisional application No. 61/655,240, filed on Jun. 4, 2012.

(51) Int. Cl.
| | | |
|---|---|---|
| *H05K 5/04* | (2006.01) | |
| *B32B 15/01* | (2006.01) | |
| *C23F 1/02* | (2006.01) | |
| *H04M 1/02* | (2006.01) | |

(Continued)

(52) U.S. Cl.
CPC ............... *H05K 5/04* (2013.01); *B32B 15/012* (2013.01); *C22C 1/02* (2013.01); *C23F 1/02* (2013.01); *G06F 1/1613* (2013.01); *G06F 1/1679* (2013.01); *G06F 1/181* (2013.01); *H04M 1/0249* (2013.01); *Y10T 29/49002* (2015.01); *Y10T 428/12347* (2015.01); *Y10T 428/12361* (2015.01); *Y10T 428/12757* (2015.01); *Y10T 428/12979* (2015.01); *Y10T 428/24802* (2015.01); *Y10T 428/24851* (2015.01); *Y10T 428/24917* (2015.01)

(58) Field of Classification Search
CPC ......... B32B 3/10; B32B 15/012; G06F 1/16; G06F 1/1613; G06F 1/181; Y10T 428/24802; Y10T 428/24917
See application file for complete search history.

(56) References Cited

U.S. PATENT DOCUMENTS 6,468,439 B1 * 10/2002 Whitehurst et al. ............ 216/95
8,273,986 B2    9/2012 Liu et al.
(Continued)

FOREIGN PATENT DOCUMENTS

| CN | 102069672 A | 5/2011 |
|---|---|---|
| CN | 102137554 A | 7/2011 |

(Continued)

OTHER PUBLICATIONS

Search Report and Written Opinion for International Application No. PCT/US2013/043837, mailed Aug. 7, 2013, 9 pages.

(Continued)

*Primary Examiner* — Gerard Higgins
(74) *Attorney, Agent, or Firm* — Brake Hughes Bellermann LLP (57) ABSTRACT

A method includes creating an opening in a first outer layer of a multilayer sheet of material, the sheet of material having three or more layers of material, including the first outer layer and a second outer layer. A selective etchant is introduced through the opening, where the etchant selectively etches an interior metal layer of the multilayer sheet of material compared with the first and second outer layers. The selective etchant is permitted to etch material of the interior metal layer under the first outer layer.

8 Claims, 10 Drawing Sheets

(51) Int. Cl.
  *G06F 1/16* (2006.01)
  *G06F 1/18* (2006.01)
  *C22C 1/02* (2006.01)

(56) References Cited

U.S. PATENT DOCUMENTS

| | | | |
|---|---|---|---|
| 8,315,043 B2* | 11/2012 | Lynch et al. | 361/679.02 |
| 8,667,661 B2* | 3/2014 | Filson et al. | 29/460 |
| 2009/0190290 A1 | 7/2009 | Lynch et al. | |
| 2009/0260871 A1* | 10/2009 | Weber | 174/535 |
| 2010/0159273 A1* | 6/2010 | Filson et al. | 428/653 |
| 2011/0183091 A1 | 7/2011 | Zhu et al. | |

FOREIGN PATENT DOCUMENTS

| | | |
|---|---|---|
| WO | 2009129123 A1 | 10/2009 |
| WO | 2011087487 A1 | 7/2011 |

OTHER PUBLICATIONS

"Aluminium etching", www.microchemicals.eu/technical_information, Dec. 15, 2009, 3 pages.

Ohji, et al, "Fabrication of mechanical structures in p-type silicon using electrochemical etching", Sensors and Actuators 82, May 15, 2000, pp. 254-258.

International Preliminary Report on Patentability for International Application No. PCT/US2013/043837, mailed on Dec. 18, 2014, 6 pages.

Chinese Office Action with English Translation from corresponding application CN201380040664.4, dated Dec. 15, 2015, 6 pages.

* cited by examiner

ETCHED MULTI-LAYER SHEETS

CROSS-REFERENCE TO RELATED APPLICATIONS

This application claims priority to, and the benefit of, U.S. Provisional Application Ser. No. 61/655,240, entitled "ETCHED MULTI-LAYER SHEETS," filed on Jun. 4, 2012, the disclosure of which is hereby incorporated herein by reference in its entirety.

TECHNICAL FIELD

This description relates generally to multi-layer sheets of material in which different layers can be differentially etched by an etching material to selectively remove portions of one or more particular layers.

BACKGROUND

Sheets of material can be used as housing material for a variety of products, such as computer cases, cell phone and smartphone cases, etc. Because the housing walls of a product can be a major contributor to the thickness of the product, it can be desirable to have a thin housing wall that nevertheless has pleasing aesthetics, such as accurate contours and flats, control of the color, texture, reflectance, feel, etc. In addition, because a product may have several housing walls nested within each other, the thickness of a housing wall can have a multiplier effect on the overall thickness of the product.

SUMMARY

This description generally describes multi-layer sheets of materials that can be selectively etched to create sheets having an internal structure. Such sheets can have favorable structural properties while also being low-weight.

In one general aspect, a method includes creating an opening in a first outer layer of a multilayer sheet of material, the sheet of material having three or more layers of material, including the first outer layer and a second outer layer. A selective etchant is introduced through the opening, where the etchant selectively etches an interior metal layer of the multilayer sheet of material compared with the first and second outer layers. The selective etchant is permitted to etch material of the interior metal layer under the first outer layer.

In another general aspect, a portable computing device includes a multilayer housing wall having three or more layers of material. The housing wall is prepared by creating an opening in a first outer layer of the multilayer sheet of material. A selective etchant is introduced through the opening, wherein the etchant selectively etches an interior metal layer of the multilayer sheet of material compared with the first outer layer. The selective etchant is permitted to etch material of the interior metal layer under the first outer layer.

In another general aspect, an apparatus includes a first multilayer sheet and a second multilayer sheet. The first multilayer sheet has three or more layers of material. A section of the first outer layer of the first multilayer sheet includes flanges having a width in a direction parallel to a plane of the layers that is greater than a width of an interior layer underlying the section. The second multilayer sheet has three or more layers of material, and a first outer layer of the second multilayer sheet includes two separate sections, where each section has a flange that extends from a portion of the outer layer of the second multilayer sheet in a direction toward the other flange and where each flange is not supported by an underlying interior layer of the second multilayer sheet. The flanges of the first multilayer sheet are located between the flanges of the second multilayer sheet and a second outer layer of the second multilayer sheet. The first multilayer sheet being prepared by creating an opening in the first outer layer of the first multilayer sheet of material. A selective etchant is introduced through the opening, where the etchant selectively etches an interior metal layer of the first multilayer sheet of material compared with the first outer layer. The selective etchant is permitted to etch material of the interior metal layer under the first outer layer. The second multilayer sheet is prepared by creating an opening in the first outer layer of the second multilayer sheet of material. A selective etchant is introduced through the opening, where the etchant selectively etches an interior metal layer of the second multilayer sheet of material compared with the first outer layer. The selective etchant is permitted to etch material of the interior metal layer under the first outer layer.

The details of one or more implementations are set forth in the accompanying drawings and the description below. Other features will be apparent from the description and drawings, and from the claims.

DETAILED DESCRIPTION

Figure 1A:
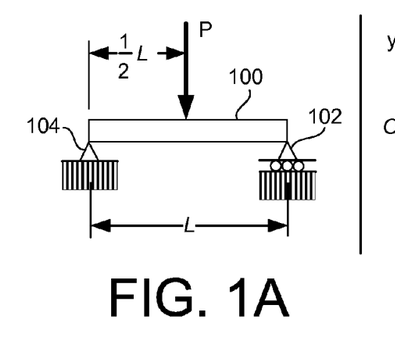
FIGS. 1A and 1B are schematic diagrams of a beam of material illustrating parameters that affect the stiffness of the beam.
Figure 1B:
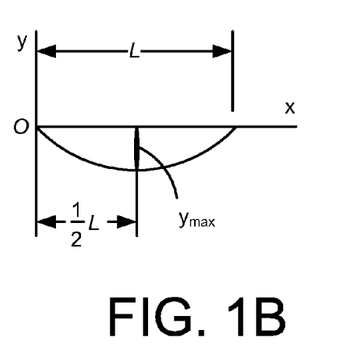

FIGS. 1A and 1B are schematic diagrams of a beam of material illustrating parameters that affect the stiffness of the beam 100. As shown in FIG. 1A, the parameter, L, is the span of the beam 100 between two support points 102, 104 at the ends of the beam. The parameter, P, is a force applied to the beam 100, and the parameter, E, represents the modulus of elasticity of the beam. The parameter, I, is a moment of inertia for the beam 100, which is proportional to a cube of the thickness of the beam. As shown in FIG. 1B, the stiffness of a beam can be defined in terms of the force required to create a particular maximum deflection value ($y_{max}$), and the stiffness ($P/y_{max}$) can be proportional to $EI/L^3$. For a solid beam with a square cross-section of the stiffness is equal to 48 $EI/L^3$.

To improve the stiffness of a beam, it may desirable to focus first on the cubed terms, i.e. the moment of inertia, I, which is proportional to the cube of the thickness of the beam and the span, L. Thus, a product designer may desire to design a product in which long spans are avoided and in which locally short spans are used with thin walls over tall components housed within the product. Additionally, the product designer may want to tightly control the thickness of the product walls. As described herein, etched multilayer sheets offer a structure to precisely control the thickness of the housing walls of a product so that the wall can be relatively thick for long spans and thin for short spans that are used to enclose tall components within the housing.

Figures 2, 3:
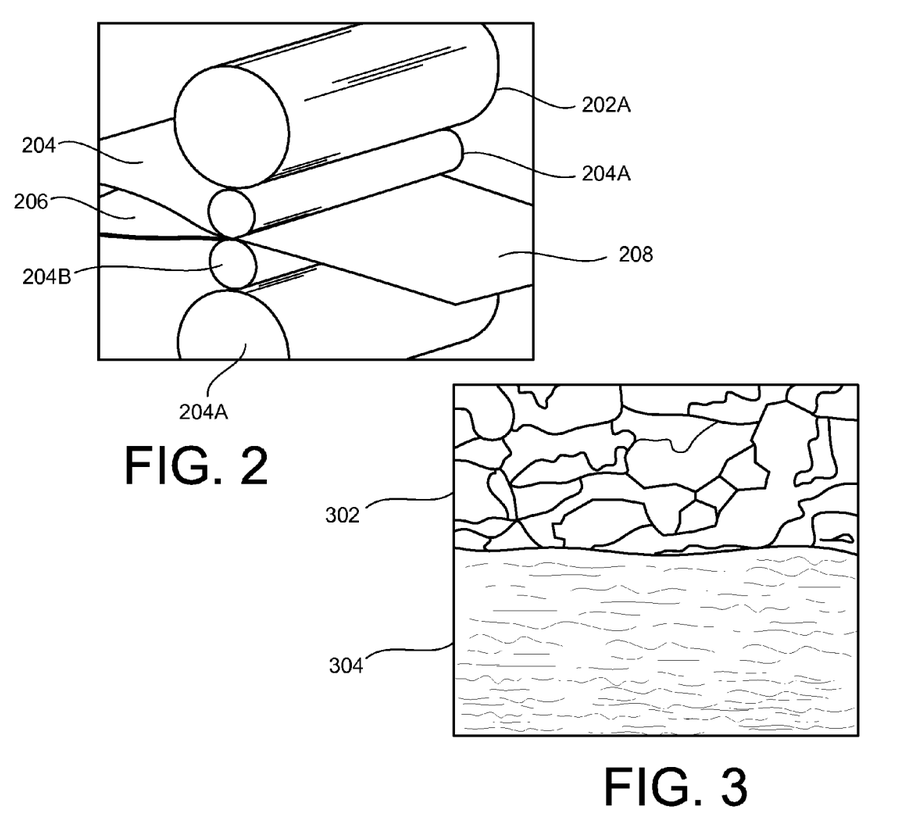
FIG. 2 is an example perspective view of a system for producing a sheet material composed of dissimilar metals that are pressed together, whereby they become metallurgically bonded.
FIG. 3 is a schematic diagram of a metallurgical bond between two dissimilar metals.

FIG. 2 is an example perspective view of a system 200 for producing a sheet material composed of dissimilar metals that are pressed together, whereby they become metallurgically bonded. The system can include rollers 202A, 202B, 204A, 20/B that apply pressure to sheets or material 204, 206 to press the sheets of material together to bond the sheets of material to create a single multi-layer sheet 208. Although two sheets of material 204, 206 are shown in FIG. 2, it is understood that more than two sheets of material can be bonded together simultaneously. FIG. 3 is a schematic diagram of a metallurgical bond between two dissimilar metals, i.e., a first metal material 302 and a second metal material 304. For dissimilar metals having different thermal expansion coefficients, an asymmetric multilayer stack of the bonded material can be distorted or deformed due to temperature changes. A symmetric multilayer stack (i.e., having top and bottom layers of a first material that sandwich a middle layer of a second material) may not be prone to distortion or deformation due to temperature changes.

For example, a multilayer sheet having top and bottom layers comprised of stainless steel, or a stainless steel alloy, and a middle layer comprised of aluminum or an aluminum alloy can offer several advantages. It is understood that when a layer is described in this description as being composed of a particular sort of material (e.g., aluminum), it is understood that the material can include an alloy of the named material, except where the material is explicitly described as being composed of only the named material.

The creation of a multilayer sheet through the rolling process described above with respect to FIG. 2 can allow tight control of the thickness of the multilayer sheet. A symmetric multilayer sheet 208 having outer layers of stainless steel and an inner layer of aluminum can be relatively stiff because the stainless steel layers, which have a modulus of elasticity that is on the order of three times that of the aluminum layer are located far from the central axis of the multilayer sheet. However, the stainless-aluminum-stainless multilayer sheet can be lighter than a solid stainless steel sheet of similar thickness because the density of aluminum is approximately three times less than the density of stainless steel. Moreover, the thermal conductivity of a stainless-aluminum-stainless sheet can be superior to that of a solid stainless steel sheet because the thermal conductivity of aluminum is approximately 10 times greater than that of stainless steel.

As described herein, when starting with a multi-layer sheet (e.g., a stainless-aluminum-stainless multilayer sheet), one or more openings can be created in one of the outer layers (e.g., a stainless steel layer), and then an etching material can be provided through the opening(s), where the etchant selectively etches the inner layer (e.g., the aluminum layer) to create unique structures within the multilayer sheet.

Figure 4A:
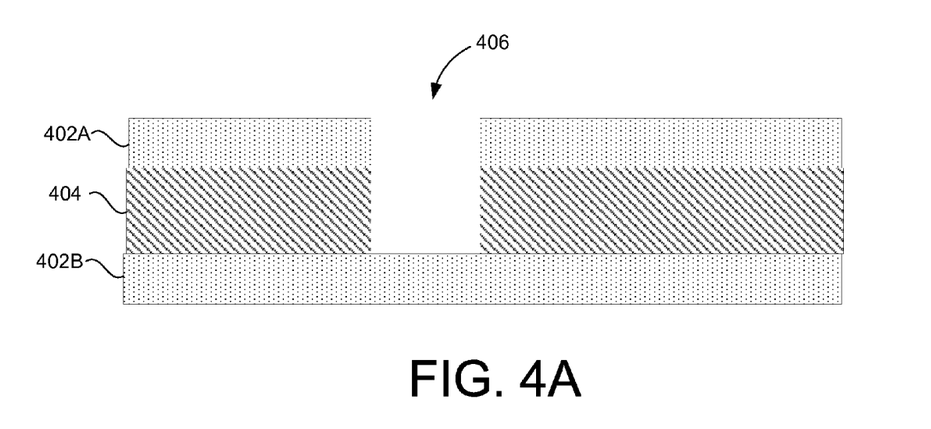
FIGS. 4A and 4B are schematic diagrams of a multilayer sheet having outer layers of stainless steel and a middle layer of aluminum.

For example, as shown in FIG. 4A, in a multilayer sheet having outer layers 402A, 402B of stainless steel and a middle layer 404 of aluminum, an opening can be created in one of the stainless steel layers 402A (and possibly also through a portion of the aluminum layer). The opening can be created in a number of different ways. For example, the opening can be created mechanically (e.g., by milling or drilling through the layer), thermally (e.g., by intense laser radiation), or chemically (e.g., by etching with a chemical). When creating one or more openings in a multilayer sheet using a chemical process, a resist material can be applied to a surface of the sheet, and then a pattern can be created in the resist material (e.g., by exposing the resist material to a pattern of radiation). Then, the resist material (e.g. dry film photoresist) can be developed, and resist material can be selectively removed to leave the pattern of the resist material on the surface of the multilayer sheet. Then, a chemical (e.g., ferric chloride) can be applied to the surface of the sheet, where the chemical attacks the exposed metal of the multilayer sheet but not the resist material or the metal under the pattern of resist material.

Figure 4B:
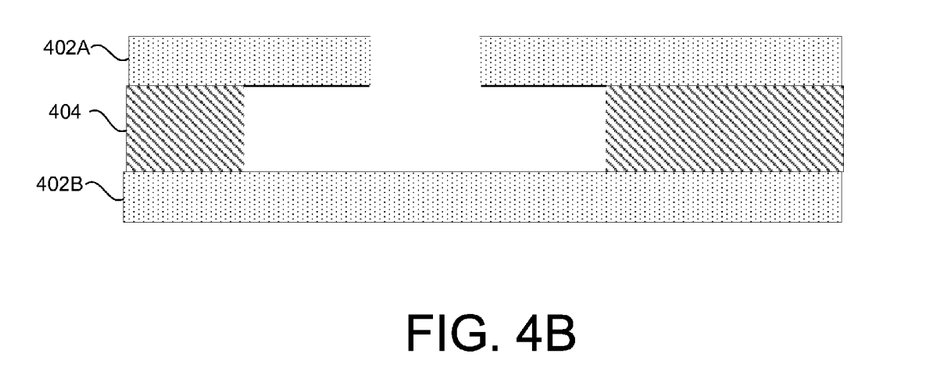

After creation of the openings through the top layer of stainless steel, a selective etching material can be provided through the opening to selectively attack the inner layer of aluminum, to remove portions of the aluminum layer that extend underneath the top layer of stainless steel, as shown in FIG. 4B. A variety of different etchants can be used that selectively etch aluminum but that have relatively little effect on stainless steel. For example, sodium hydroxide is an etchant that aggressively attacks aluminum but that leaves most other metals alone under normal etching temperatures. Sodium hydroxide can etch pure aluminum at a faster rate than aluminum alloys (e.g., on the order of 30% faster) and can etch both pure aluminum and aluminum alloys at a much faster rate than stainless steel (e.g., at a rate hundreds or thousands of times faster). Potassium hydroxide has similar properties to those of sodium hydroxide and is another possible etchant. If a resist material has been applied to a surface of the multilayer sheet, the resist material can be removed either after creating the opening in the top stainless steel layer 402A or after applying the selective etchant that attacks the aluminum metal layer 404.

Figure 5A:
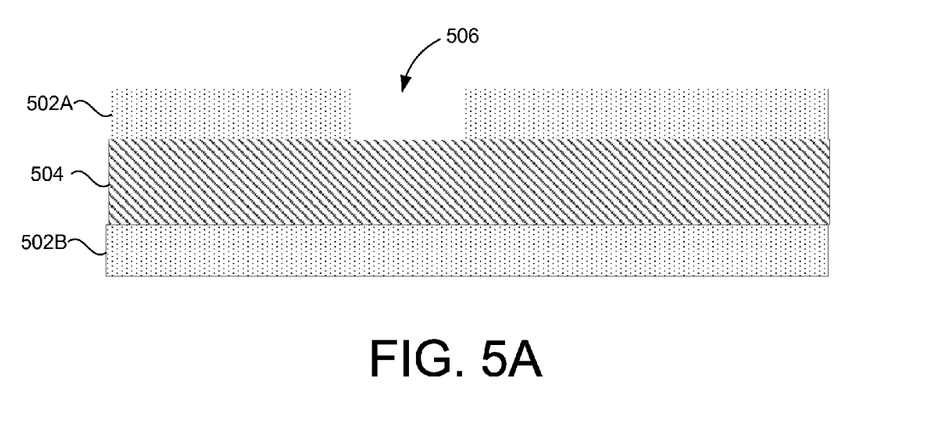
FIGS. 5A and 5B are schematic cross-sectional diagrams of a multilayer sheet of material.
Figure 5B:
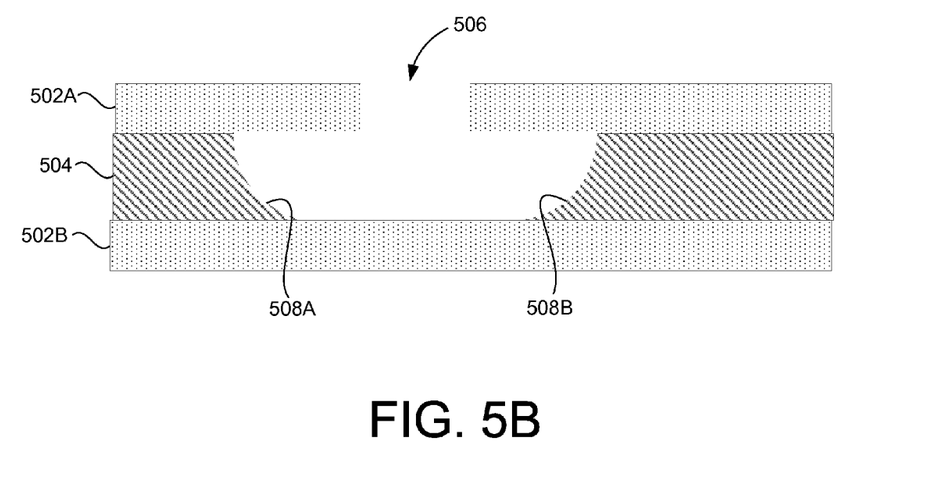

FIGS. 5A and 5B are schematic cross-sectionals diagram of a multilayer sheet of material. The sheet of material can include outer stainless steel layers 502A, 502B and an inner aluminum layer 504. A minimum depth "pilot opening" 506 can be created in a top stainless steel layer, and then etchant can be introduced to the middle aluminum layer through the pilot opening 506. Then, a selective etchant can be introduced through the pilot opening 506, and the etchant can attack the middle aluminum layer 504 and selectively remove the aluminum, as shown in FIG. 5B. An idealized spherical etch front 508A, 508B is depicted in FIG. 5B, although a typical etch front is usually flatter than what is depicted in FIG. 5B. A comparison of FIG. 4B and FIG. 5B reveals that although the profile of the opening in the aluminum layer 402A, 502A may depend somewhat on the depth of the initial pilot opening 406, 506 and the maximum diameter of the opening 406, 506 in the aluminum layer, it does not depend on the depth of the initial opening 406, 506. Therefore, the depth of the initial opening 406, 506 into the inner layer 404, 504 need not be precisely controlled, and the thickness of the metal layers 402A, 402B, 502A, 502B can be precisely maintained over a broad range of initial opening depths and etching conditions.

These techniques of selectively etching the middle layer 404, 504 of a multilayer sheet can be used to create structures in the housing walls for electronic products. For example, multilayer sheets having an etched middle layer can be used as the housing walls of computers or mobile phones. For example, the sheet of material can form one of the external walls of a portable computing device (e.g., a mobile phone, a tablet computer, a notebook computer). When used as an external wall of a mobile phone, the sheet of material can have an area that is greater than about 6 in$^2$ and can have a thickness that is less than about 2 mm. When used as an external wall of a tablet computer or a notebook computer, the sheet of material can have an area that is greater than about 30 in$^2$ and the thickness that is less than about 2 mm. The portable computing device that includes etched multilayer housing walls can include a plurality of integrated circuits (e.g., a central processing unit, a memory, etc.) mounted on a mainboard, which is disposed inside the housing of the computing device. The portable computing device can be, for example, a laptop computer, a hand held computer, a tablet computer, a netbook computer, a mobile phone, or a wearable computer a personal digital assistant.

Figure 6:
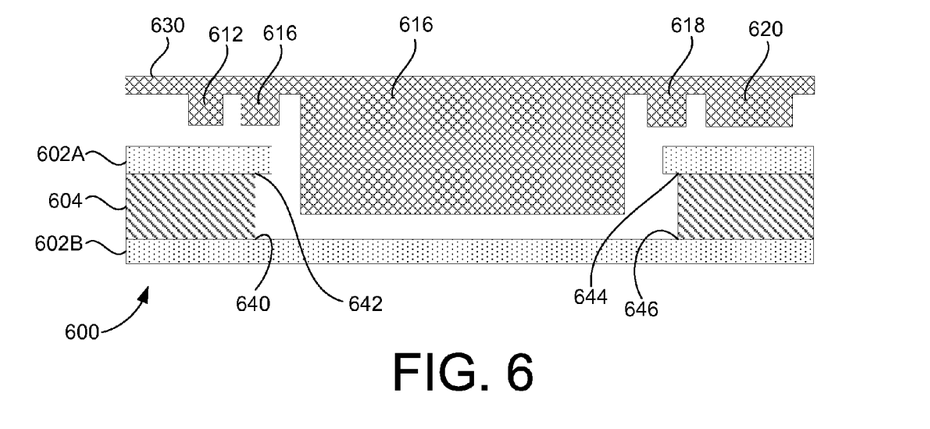
FIG. 6 is a schematic diagram of a multilayer sheet and example components of an electronic product.

For example, FIG. 6 is a schematic diagram of a multilayer 600 sheet and example components 612, 614, 616, 618, 620 of an electronic product. The components 612, 614, 616, 618, 620 can be mounted on a circuit board 630 and can be enclosed by a housing that includes the multilayer sheet 600. The multilayer sheet 600 has a middle aluminum layer 604, sandwiched between two stainless steel layers 602A, 602B, which can be selectively etched to make the wall thickness of the multilayer sheet 600 locally thinner in a region of a sheet, so that an isolated tall component 616 of the electronic product can be accommodated by the housing wall that includes the multilayer sheet 600. For example, inductors can be relatively large components on printed circuit boards that protrude up from the surface of the printed circuit board. By creating a housing wall that is locally thin in an area near the location of an inductor, the profile of the inductor can be accommodated by the housing wall while maintaining a thin profile for the overall device. The locally thin area of the housing wall also could be used to accommodate a battery cell or could be used to create an airflow channel around a heat-generating device within the electronic product.

To guard against corrosion between adjacent layers of the multilayer sheet 600, a moisture barrier can be placed over the joint between the different layers. For example, a moisture barrier can be placed at the joints 640, 642, 644, 646 between the aluminum and stainless steel layers. The moisture barrier can include a layer of wax, epoxy or thermoplastic material. The material of the moisture barrier can be mixed with a solvent and spread along the interface between the different layers 602A, 604, 602B. Then, when the solvent evaporates, the moisture barrier can be left over the joint between the different layers.

Figure 7:
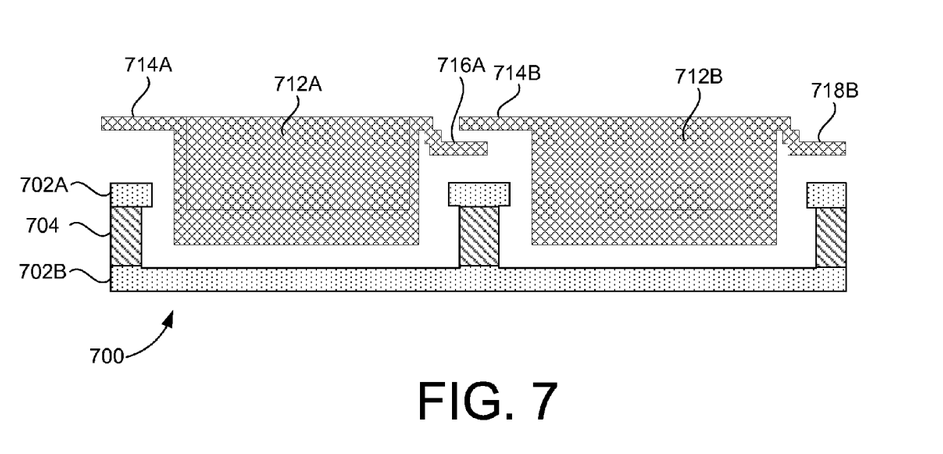
FIG. 7 is another schematic diagram of a multilayer sheet and example components of an electronic product.

FIG. 7 is another schematic diagram of a multilayer 700 sheet and example components of an electronic product. The multilayer sheet 700 has a middle aluminum layer 704, sandwiched between two stainless steel layers 702A, 702B. The sheet can be part of the housing of an electronics product. The middle layer 704 can be can be selectively etched to locally thin the sheet 700 in a plurality of regions to accommodate various structures within the housing of the product. For example, multiple battery cell pouches 712A, 712B having flat flanges 714A, 716A, 714B, 716B can be accommodated, where the thick part of the pouch 712A, 712B is positioned within the thinned part of the housing wall and the flanges 714A, 716A, 716A, 716B of the battery cell pouches can be overlaid on thicker portions of the housing wall. The battery cell pouches 712A, 712B can be bonded into the cavities formed by the removal of an inner aluminum layer 704 of the multilayer sheet housing wall. In some implementations, the thicker portions of the housing wall can be supported in the completed structure of the product so that long spans of the housing wall are minimized, thereby retaining stiffness of the housing wall. For example, bonding material between the battery cell pouches 712A, 712B and the stainless steel layer 702A ma create a continuous span along a length of the multilayer sheet.

Figure 8A:
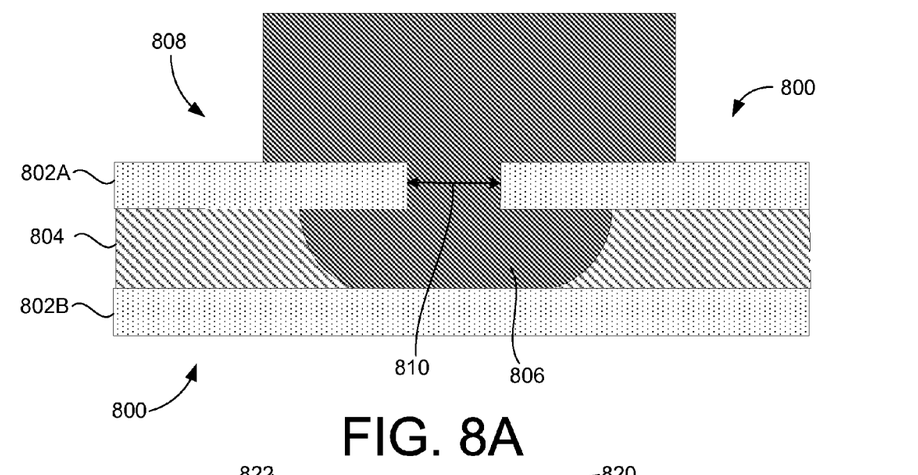
FIG. 8A is a schematic cross-sectional diagram of multilayer sheet having an etched cavity that is filled with a molding material.
Figure 8B:
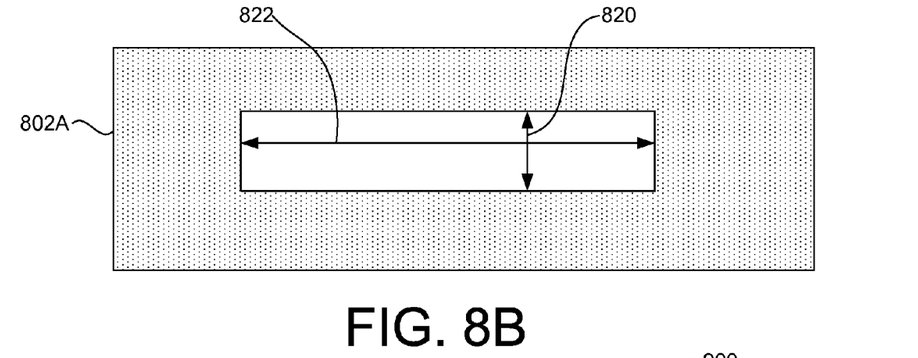
FIG. 8B is a top view of a top layer of the sheet shown in FIG. 8A.

FIG. 8A is a schematic cross-sectional diagram of multilayer sheet 800 having an etched cavity that is filled with a molding material. The multilayer sheet 800 can include top and bottom layers 802A, 802B that sandwich a middle layer 804. FIG. 8B is a top view of the top layer 802A of the sheet 800. The top and bottom layers 802A, 802B can include stainless steel and the middle layer 804 can include aluminum. As described above a cavity can be etched within the middle layer 804 through a selective editing process. The process can include under-cutting the middle layer 804 beneath the top layer 802A to form a cavity within the multilayer sheet 800. After the cavity is etched, material can be molded into the cavity. For example, after removing a portion of the middle layer 804 to form a cavity between the top and bottom layers 802A, 802B, material 806 can be injected into the cavity and then solidified so that the material is fixed in place. The material 806 can be a continuous part of a molded part 808 that extends above the top layer 802A, such that the part 808 above the top layer is firmly attached to the sheet 800 by the molded material 806 that is molded within the sheet.

The etched clad techniques described herein also allow economical undercuts to create removable locking features such as twist lock fasteners and latches (rotary), and tabs or lips (linear). The selective etching techniques also allow locking detent openings to be simultaneously made by the same etching operation. For example, the dimensions of the material 806 within the cavity in the middle layer 804 can be longer within the plane of the page shown in FIG. 8A than in the plane that extends into the page, and the dimensions of the opening 810 in the top layer 802A can be shorter in the plane of the page shown in FIG. 8 than in the plane that extends into the page. For example, as shown in FIG. 8B, a first dimension 822 of the opening can be shorter than a second dimension 822 of the opening. Then, when the part 808 is rotated by 90 degrees, length of the material 806 within the cavity can be the part can be extracted from the multilayer sheet 800. For example, as shown in FIG. 8B the width of the material 806 under the top sheet 802A can be greater than the first dimension 820 but smaller than the second dimension 822. Thus, when material 806 is placed within the cavity and oriented along the direction of the first dimension, the part is locked in place. However, when the material 806 is oriented along the direction of the second dimension, the part can be extracted from the multilayer sheet of material.

Figure 9:
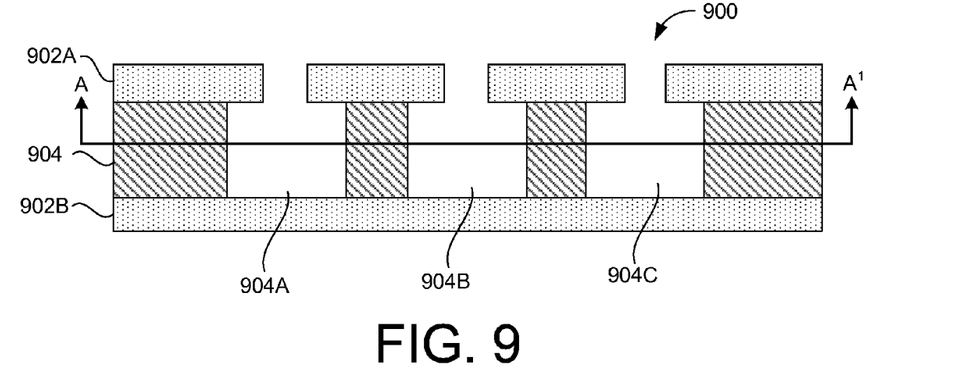
FIG. 9 is a schematic cross-sectional diagram of another multilayer sheet that includes a middle layer sandwiched between a top layer and a bottom layer.

FIG. 9 is a schematic cross-sectional diagram of another multilayer sheet 900 that includes a middle layer 904 sandwiched between a top layer 902A and a bottom layer 902B. As shown in FIG. 9, multiple cavities 904A, 904B, 904C can be formed in a multilayer sheet of material through a selective etching process to remove material from the sheet and therefore make the sheet lighter. The multiple cavities can be used to house a plurality of components.

Figure 10:
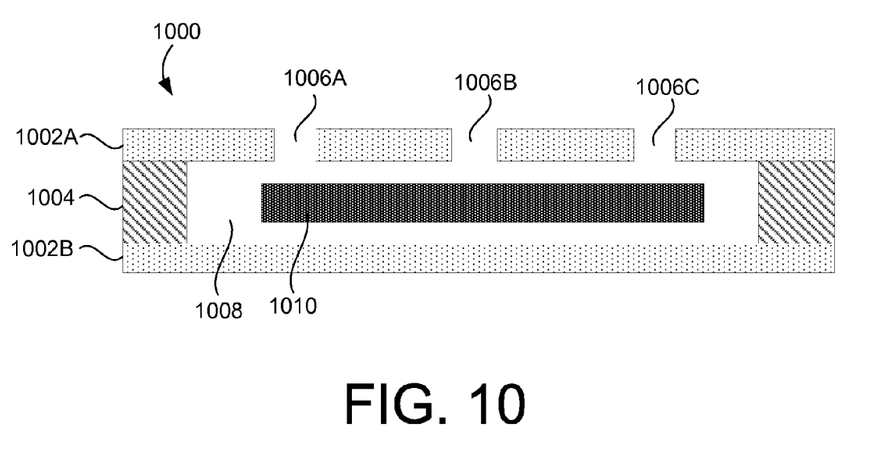
FIG. 10 is a schematic cross-sectional diagram of another multilayer sheet that includes a middle layer sandwiched between a top layer and a bottom layer.

FIG. 10 is a schematic cross-sectional diagram of another multilayer sheet 1000 that includes a middle layer 1004 sandwiched between a top layer 1002A and a bottom layer 1002B. As shown in FIG. 10, allowing the etching process to continue working on the structure shown in FIG. 9 can remove additional material from the middle layer 1004 to create a large, continuous cavity between the top and bottom layers. Although the middle two sections of the top layer appear to be hovering unsupported and FIG. 10, it must be remembered that FIG. 10 is a cross-section of a multilayer sheet of material and shows the pilot openings 1006A, 1006B, 1006C that were created in the top layer 1002A to introduce the etchant into the middle layer 1004. Therefore, a view through a different section of the multilayer sheet of material would show the top layer 1002A extending across the entire distance from the left side to the right side of FIG. 10, and because of this the middle two sections of the top layer 1002A shown in FIG. 10 are supported by the rest of the top layer of the sheet. Within the cavity 1008 formed in the multilayer sheet shown in FIG. 10, a component 1010 of the electronic component can be introduced. For example, the component 1010 can include a flat flexible cable, so that when the multilayer sheet 1000 is used as a housing wall of an electronic product, the multilayer sheet 1000 can be used to house cables for carrying signals and power within the electronic product. In some implementations, the component 1010 can include light emitting devices (e.g., one or more light emitting diodes).

Figure 11:
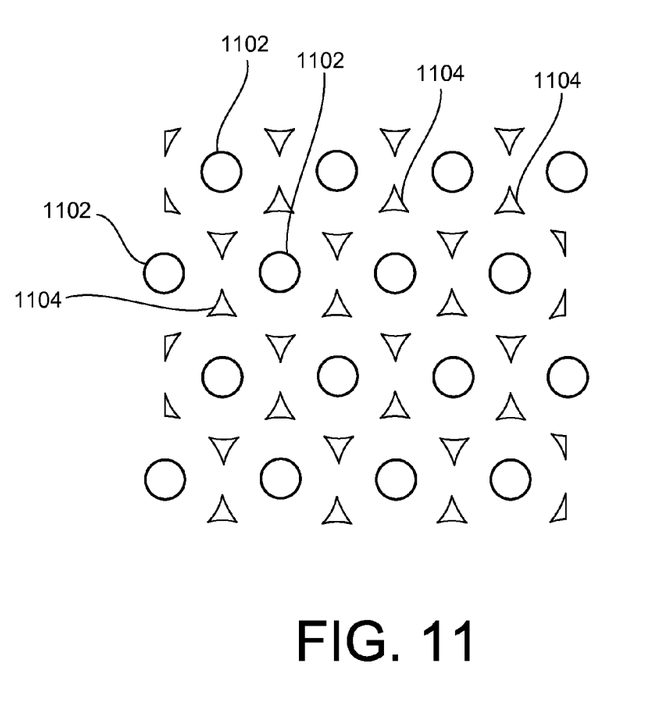
FIG. 11 is a bottom view of the multilayer sheet of FIG. 9 through line A-A' in FIG. 9.

FIG. 11 is a bottom top view of the multilayer sheet 900 through line A-A' shown in FIG. 9. As shown in FIG. 11, a plurality of openings 1102 can be created in the top layer 902A and etchant can be introduced into the openings to selectively remove portions of the middle layer 904 to create a pseudo-honeycomb structure that can be light and stiff. Close control of the etching time allows isolated columns or "islands" of aluminum 1104. The islands of aluminum can reduce the risk of "doming" due to temperature changes, where doming can be due to the different coefficients of thermal expansion for the stainless-aluminum-stainless portions of the sheet as compared with the stainless only portions of the sheet in which the aluminum inner layer has been removed. Material can be introduced between the islands of aluminum 1104. For example, a phase change material that is used for thermal management can be introduced in the voids formed by the removal of the portions of the middle layer of aluminum.

Figure 12:
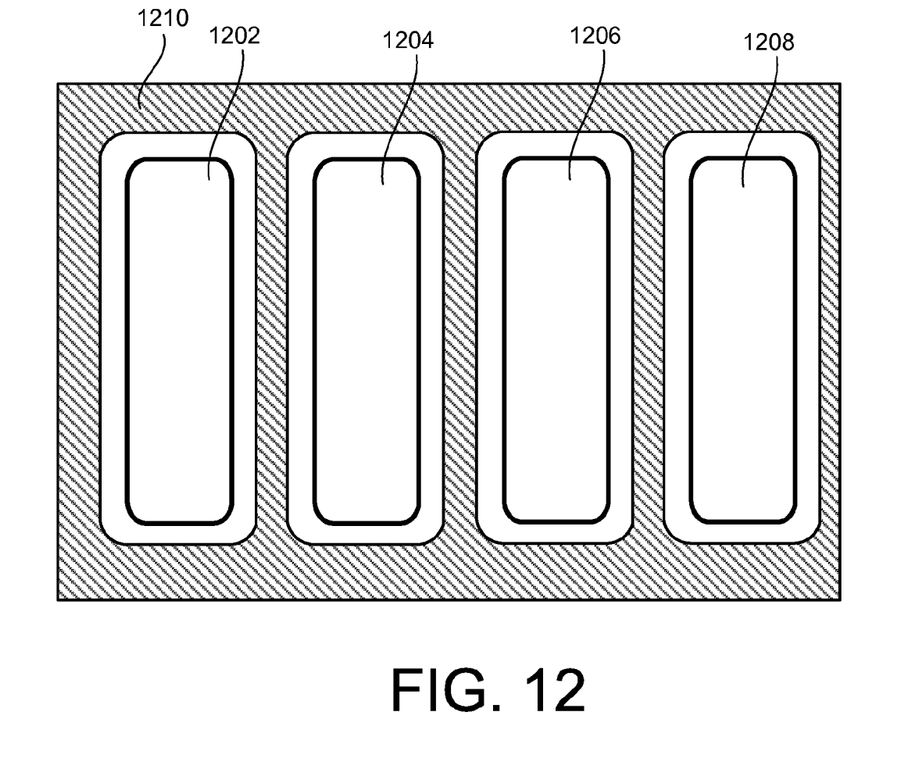
FIG. 12 is a top view of a multilayer sheet.

FIG. 12 is a top view of a multilayer sheet. A pattern of openings 1202, 1204, 1206, 1208 can be created in a top layer 1210 of the sheet, and then the middle layer can be attacked with an etchant to create a design that provides structure were needed, e.g., to provide stiffness between battery cells, and which provides aluminum conduction paths for thermal management of heat created from the battery packs. Aluminum has a high heat conductivity compared to stainless steel and therefore is advantageous for conducting heat. Although the stainless steel outer layers have relatively low thermal conductivity they can have a large area for coupling heat into and out of the aluminum core structure. Other patterns can be used to manage heat from other component types, such a transistors, integrated circuits, resistors and inductors.

Figure 13:
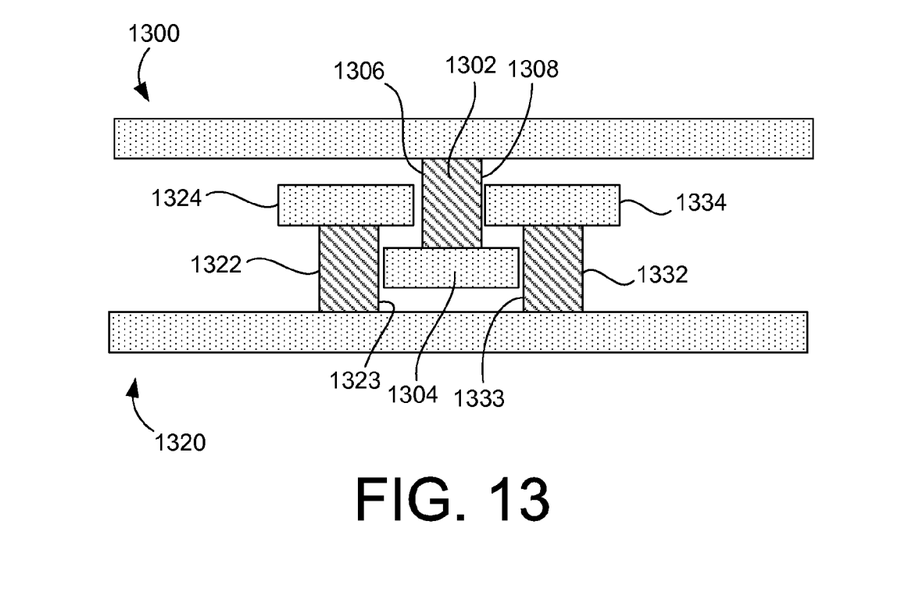
FIG. 13 is a schematic cross-sectional diagram of two interlocking multilayer sheets.

FIG. 13 is a schematic cross-sectional diagram of two interlocking multilayer sheets 1300, 1320. As shown in FIG. 13, the two sheets of material 1300, 1320 are coupled together. The layers of the sheets extend into the page, and therefore sheet 1300, 1320 can slide relative to each other. For example, sheet 1320 can have two aluminum posts 1322, 1332 topped with stainless steel sheets 1324, 1334 that extend past the edges 1323, 1333 of the posts. The aluminum posts 1322, 1332 and the stainless steel sheets 1324, 1334 extend into the page as shown in FIG. 13. Sheet 1300 can have a single aluminum post 1302 topped with a stainless steel sheet 1304 that extends past the edges 1306, 1308 of the post. The stainless steel tops 1324, 1334 of sheet 1320 can interlock with the stainless steel top 1304 of sheet 1300, so that the sheets 1300, 1320 can then slide relative to each other, into and out of the page as shown in FIG. 13.

A variety of other structures also can be created. For example, offset openings in the top and middle layer can create airtight and liquid-tight passages, which could be used for pneumatic or hydraulic logic or actuators. Passages within the sheet could be used as electromagnetic waveguides or as acoustic waveguides for sound.

Figure 14:
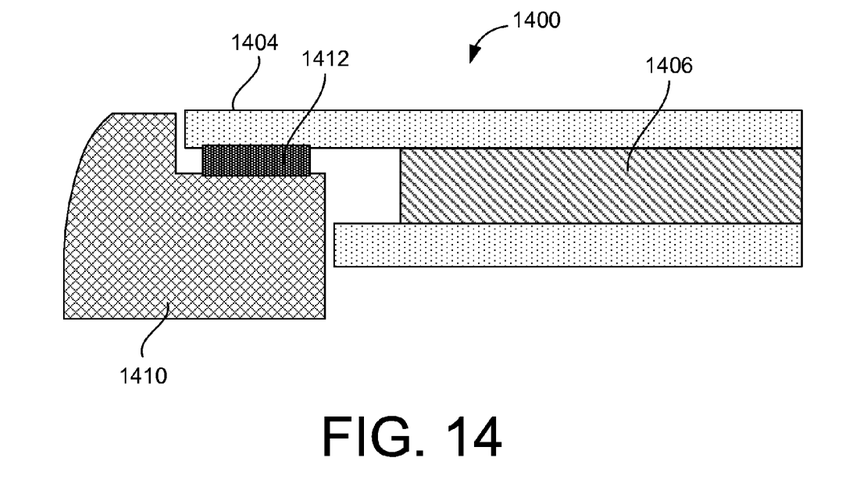
FIG. 14 is a schematic cross-sectional diagram of another multilayer sheet.

FIG. 14 is a schematic cross-sectional diagram of another multilayer sheet 1400. As shown in FIG. 14, a middle layer 1406 of the multilayer sheet 1400 can be etched so that a flange 1404 extends one layer extends of the multilayer sheet. The flange 1404 can be bonded or welded to a rim 1410 of a product case. Solder or adhesive material 1412 can be used to form the bond.

Figure 15:
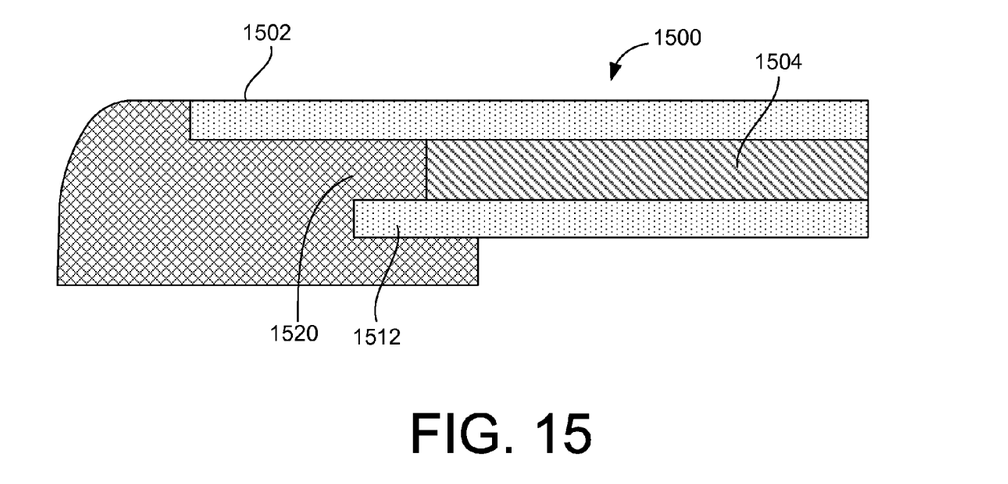
FIG. 15 is a schematic cross-sectional diagram of another multilayer sheet 1500.

FIG. 15 is a schematic cross-sectional diagram of another multilayer sheet 1500. As shown in FIG. 15, a middle layer 1504 of the multilayer sheet 1500 can be etched so that one or more flanges 1502, 1512 extend from the multilayer sheet, and the one or more flanges 1502, 1512 can be molded into a rim 1520 of a product case.

Figure 16:
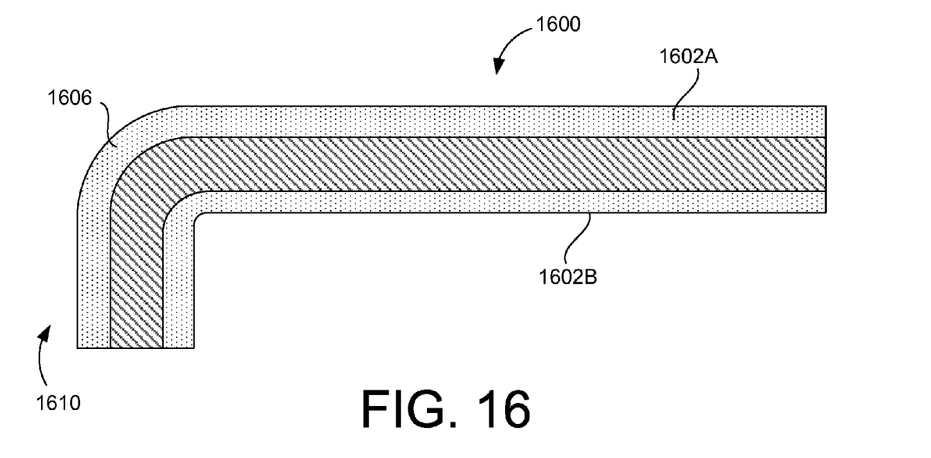
FIG. 16 is a schematic cross-sectional diagram of another multilayer sheet 1600.

FIG. 16 is a schematic cross-sectional diagram of another multilayer sheet 1600. As shown in FIG. 16, a rim 1610 can be formed directly from a multilayer sheet by bending the sheet around a corner 1606. However, rolling of the sheet during layer lamination to create the multilayer sheet work hardens the stainless steel layers 1602A, 1602B, such that the stainless steel layers of a flat multilayer sheet are typically ¼ to ¾ hard, such that the multilayer sheet typically has limited formability and has a tendency to crack when bent, particularly when bent in corners. To ameliorate the problem of cracking, the stainless steel layers could be partially annealed, e.g., through laser annealing, or stress relieving could be used by holding the sheet at a high temperature that is nevertheless below the melting temperature of the aluminum layer for several hours.

Figure 17A:
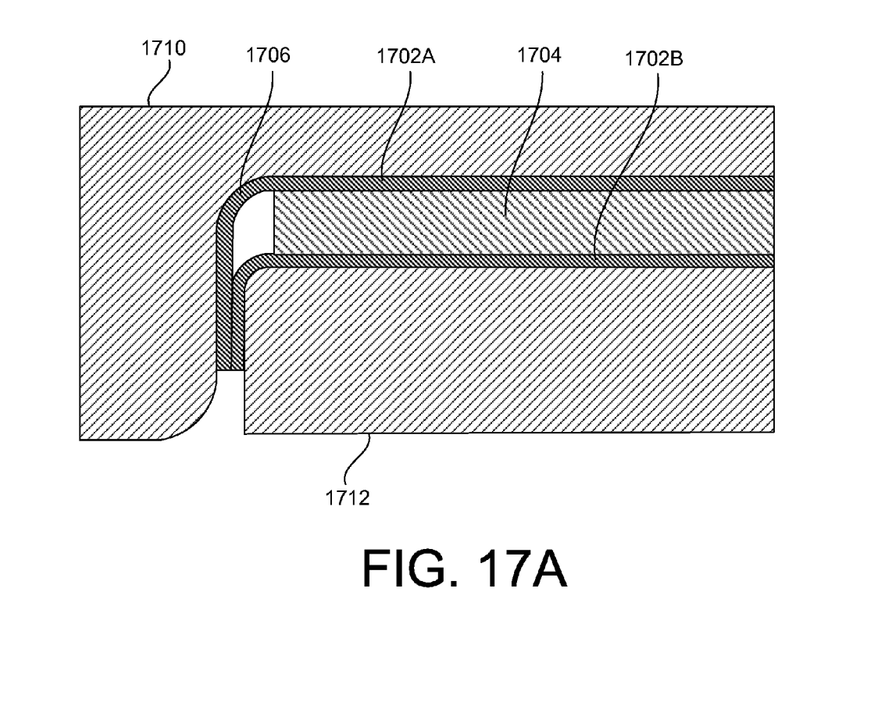
FIG. 17A is a schematic cross-sectional diagram of another multilayer sheet 1700.

FIG. 17A is a schematic cross-sectional diagram of another multilayer sheet 1700. As shown in FIG. 17A, two independent stainless steel layers 1702A, 1702B sandwich a middle aluminum layer 1704 of the multilayer sheet 1700. The stainless steel layers 1702A, 1702B can slide over each other during the process of forming the multilayer sheet to allow a tighter radius of a corner 1706 of the sheet. As shown in FIG. 17A, a clamp having a first part 1710 and a second part 1712 can be applied to the full thickness of the multilayer sheet to form the corner in both stainless steel layers. The clamp 1710, 1712 then can be removed after the corner is formed.

Figure 17B:
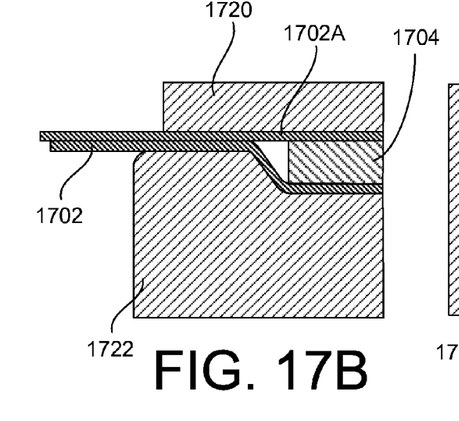
FIG. 17B and FIG. 17C are schematic cross-sectional diagrams of another way of forming multilayer sheet having a corner bend.
Figure 17C:
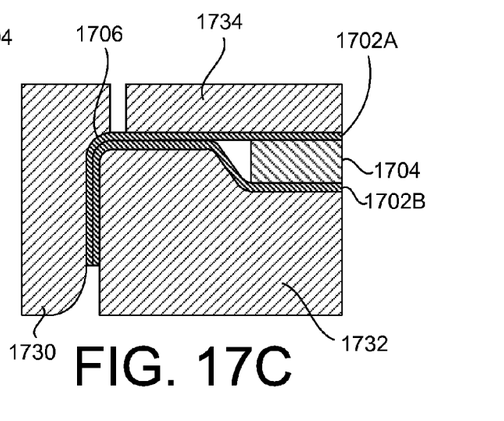

FIG. 17B and FIG. 17C are schematic cross-sectional diagrams of another way of forming multilayer sheet having a corner bend. In the implementation shown in FIG. 17B and FIG. 17C, the two outer stainless steel layers can first be squeezed together by a clamp having a first part 1720 and a second part 1722 to form an offset bend in the multilayer sheet. Then, as shown in FIG. 17C, a corner 1706 can be formed by a second clamp having a first part 1730, a second part 1732, and a third part 1734. The two outer stainless steel layers 1702A, 1702B can be welded or bonded during or after the forming and clamping process to stiffen the edge and corner.

Figure 18A:
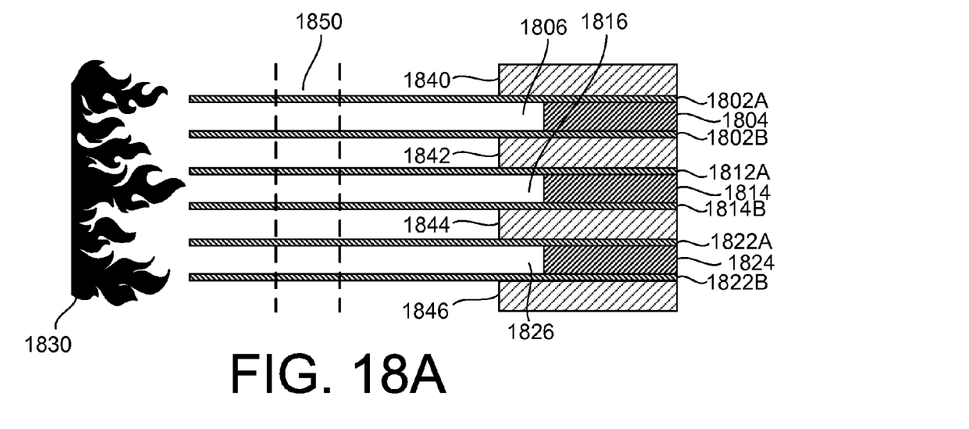
FIG. 18A is a schematic cross-sectional diagram of a plurality of multilayer sheets.

FIG. 18A is a schematic cross-sectional diagram of a plurality of multilayer sheets. As shown in FIG. 18A, annealing of the stainless steel outer layers can be performed to improve formability of the rolled multilayer sheets. For example, prior to, or after, stacking the sheets, a plurality of rolled multilayer sheets (e.g., that comprise stainless steel outer layers 1802A, 1802B, 1812A, 1812B, 1822A, 1822B, and an aluminum inner layer 1804, 1814, 1824) can have a portion 1806, 1816, 1826 of the aluminum inner layers 1804, 1814, 1824 at an edges of the sheets removed by an etching process. Then, the stainless steel outer layers at the edge of the sheets where the aluminum inner layer has been etched can be annealed Annealing can be performed with a hot gas or a reducing flame 1830, and aluminum heatsink plates 1840, 1842, 1844, 1846 can prevent overheating of the aluminum-stainless steel bondline of the multilayer sheets. In another implementation, the stainless steel edges of the multilayer sheets can be selectively laser annealed just at bend zone 1850, where the stainless steel sheets will be bent. In addition to annealing by laser or flame or hot gas, selective annealing of the stainless steel portions can also be performed via contact with a hot platten or thermode, or by immersing the edge in a hot liquid, such as solder or a molten salt.

Figure 18B:
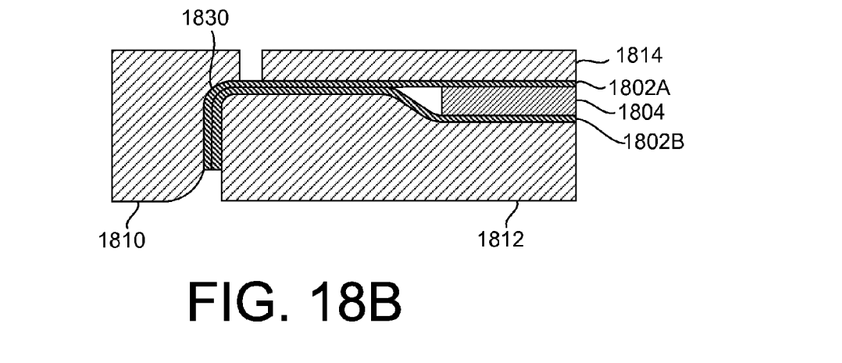
FIG. 18B is a schematic cross-sectional diagram of a single multilayer sheet that has been annealed and removed from the stack of sheets shown in FIG. 18A and formed.

FIG. 18B is a schematic cross-sectional diagram of a single multilayer sheet that has been annealed and removed from the stack of sheets shown in FIG. 18A. In the implementation shown in FIG. 18B, a corner 1830 can be formed by a clamp having a first part 1830, a second part 1832, and a third part 1834. The two outer stainless steel layers 1802A, 1802B can be welded or bonded during or after the forming and clamping process to stiffen the edge and corner.

Although the foregoing description is focused on stainless-aluminum-stainless multilayer sheets, multilayer sheets of many other materials are also possible. For example, other metals such as low-carbon steel, nickel, copper, etc. could be used, and nonmetal materials such as: glass-reinforced epoxy laminate sheets (e.g., FR 4), including active printed circuit boards with cables, antennas, etc.; exotic epoxy-fiber composite sheets, including graphite, aramid, alumina, etc. materials; molded housings with laminated interior aluminum layers and cap layers; physical vapor deposition ceramics with sprayed on aluminum layers.

What is claimed is:

1. An apparatus comprising:
   a first multilayer sheet having three or more layers of material, including a first outermost layer, an interior metal layer, and a second outermost layer, at least two adjacent layers of the first multilayer sheet being bonded together by a metallurgical bond between dissimilar metals in the adjacent layers, wherein a section of the first outermost layer of the first multilayer sheet includes flanges that extend, in a direction parallel to the plane of the first outermost layer and extend from a portion of the first outermost layer that overlies a post of the interior metal layer of the first multilayer sheet;
   a second multilayer sheet having three or more layers of material, including a first outermost layer, an interior metal layer, and a second outermost layer, wherein the first outermost layer of the second multilayer sheet includes a first section and a second section, each section having a flange that extends in a direction parallel to the plane of the first outermost layer of the second multilayer sheet, extends from a portion of the first outermost layer of the second multilayer sheet that overlies a post of the interior metal layer of the second multilayer sheet, and extends toward the respective flange of the other section of the second multilayer sheet;
   wherein at least a portion of each of the flanges of the first multilayer sheet are located between the flanges of the second multilayer sheet and the second outermost layer of the second multilayer sheet;
   and the first multilayer sheet being prepared by the process of:
   creating an opening in the first outermost layer of the first multilayer sheet;
   introducing a selective etchant through the opening, wherein the etchant selectively etches the interior metal layer of the first multilayer sheet compared with the first outermost layer; and
   etching a material of the interior metal layer under the first outermost layer of the first multilayer sheet using the selective etchant; and
   the second multilayer sheet being prepared by the process of:
   creating an opening in the first outermost layer of the second multilayer sheet;
   introducing a selective etchant through the opening, wherein the etchant selectively etches the interior metal layer of the second multilayer sheet compared with the first outermost layer; and
   etching a material of the interior metal layer under the first outermost layer of the second multilayer sheet using the selective etchant.

2. The apparatus of claim 1, wherein the first outermost layer of the first multilayer sheet includes stainless steel.

3. The apparatus of claim 1, wherein the first outermost layer of the first multilayer sheet includes a glass-reinforced epoxy laminate.

4. The apparatus of claim 1, wherein the interior layer of the first multilayer sheet includes aluminum.

5. The apparatus of claim 1, wherein the selective etchant etches the interior metal layer of the first multilayer sheet at a rate more than 100 times faster than the selective etchant etches the first outermost layer of the first multilayer sheet.

6. The apparatus of claim 1, wherein etching the material of the interior metal layer of the first multilayer sheet using the selective etchant forms a cavity in the interior metal layer; and wherein the process further includes:
   placing an electrical component of a computing device within the cavity.

7. The apparatus of claim 1, wherein the process further includes:
   creating a pattern of openings in the first outermost layer of the first multilayer sheet;
   introducing the selective etchant through the pattern of openings; and
   etching the material of the interior metal layer in a plurality of locations under the first outermost layer of the first multilayer sheet using the selective etchant.

8. The apparatus of claim 7, wherein the process further includes adding a phase change material to the first multilayer sheet to replace at least some of the material from the interior metal layer that was removed by the selective etchant.

* * * * *

UNITED STATES PATENT AND TRADEMARK OFFICE
CERTIFICATE OF CORRECTION

PATENT NO. : 9,445,517 B2
APPLICATION NO. : 13/841839
DATED : September 13, 2016
INVENTOR(S) : Hamburgen et al.

Page 1 of 1

It is certified that error appears in the above-identified patent and that said Letters Patent is hereby corrected as shown below:

In the Claims

In Column 10, Line 12, Claim 1, delete "that extend," and insert -- that extend --, therefor.

Signed and Sealed this
Thirty-first Day of January, 2017

Michelle K. Lee
*Director of the United States Patent and Trademark Office*